Oct. 23, 1962 G. C. DACEY 3,060,327
TRANSISTOR HAVING EMITTER REVERSE-BIASED BEYOND BREAKDOWN AND COLLECTOR FORWARD-BIASED FOR MAJORITY CARRIER OPERATION
Filed July 2, 1959

INVENTOR
G. C. DACEY
BY Arthur J. Torsiglieri
ATTORNEY 3,060,327
Patented Oct. 23, 1962

3,060,327

TRANSISTOR HAVING EMITTER REVERSE-BIASED BEYOND BREAKDOWN AND COLLECTOR FORWARD-BIASED FOR MAJORITY CARRIER OPERATION

George C. Dacey, Murray Hill, N.J., assignor to Bell Telephone Laboratories, Incorporated, New York, N.Y., a corporation of New York Filed July 2, 1959, Ser. No. 824,686
4 Claims. (Cl. 307—88.5)

This invention relates to arrangements for amplification which utilize semiconductive devices as the active elements.

The most common amplifier utilizing semiconductive devices for gain is an arrangement utilizing a three-layer junction transistor in which the input circuit biases the emitting junction in the forward direction, the output circuit biases the collecting junction in the reverse direction short of breakdown, and the gain mechanism involves the injection of minority carriers across the forward-biased emitting junction for flow across the base to the reverse-biased collecting junction.

A well-recognized shortcoming of an amplifier of this kind is its limited high frequency response. In particular, it is difficult in such an amplifier to realize significant gain at frequencies much above several hundred megacycles. The limitation on frequency response results primarily from the finite time it takes the minority carriers to move through the base zone of the junction transistor and to a lesser extent from the capacitances of its junctions, particularly the forward-biased emitting junction.

The present invention relates to an amplifier of extended frequency response. In particular, the increase in upper frequency limit is made possible by the inclusion of a semiconductive device which avoids both the flow of minority carriers and the large capacitance of a forward-biased emitter.

In particular, an amplifier in accordance with the invention includes a semiconductive device in which the gain mechanism is the flow of majority carriers through a portion of a semiconductive wafer, the wafer incorporating an "emitting" junction which is biased in reverse beyond breakdown by a voltage which is modulated in accordance with signal information to vary correspondingly the number of majority carriers produced at the region of breakdown. In the preferred embodiment, the semiconductive wafer also includes a collecting junction parallel and adjacent to the first junction which is biased in the forward direction in the high impedance region of the forward characteristic of the junction. Alternatively, a thin insulating film may be positioned close to the reverse-biased junction and the interface therebetween biased such that electrons which escape from the wafer cross the thin insulating film to an attached collector electrode.

Figure 1:
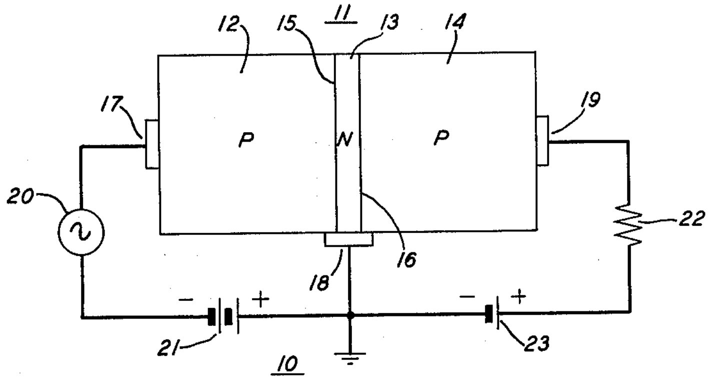
Figure 2:
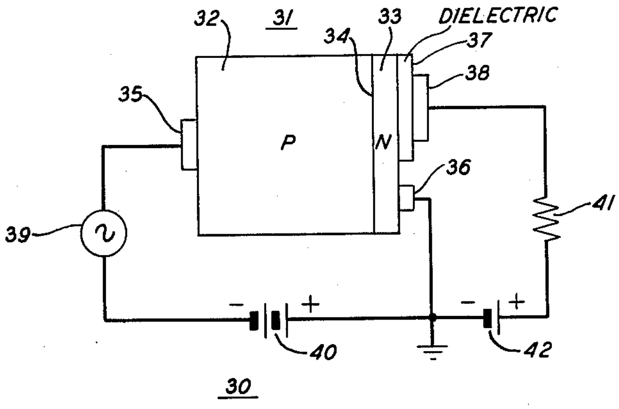

The invention will be better understood from the following more detailed description, taken in conjunction with the accompanying drawing, in which:

FIG. 1 shows as the preferred embodiment of the invention an amplifier employing a semiconductive device utilizing a three-layer semiconductive wafer of the kind described; and FIG. 2 shows as an alternative embodiment of the invention an amplifier employing a semiconductive device utilizing a two-layer semiconductive wafer on which is deposited an insulating film of the kind described.

With reference now more particularly to the drawing, the amplifier 10 shown in FIG. 1 includes a semiconductive device which comprises a PNP semiconductive wafer 11, typically monocrystalline silicon. The wafer includes emitter, base and collector zones 12, 13 and 14 defining emitting PN junction 15 and collecting NP junction 16, respectively, and emitter, base and collector electrodes 17, 18 and 19 making low resistance ohmic connections to zones 12, 13 and 14, respectively. Although the electrode 18 is shown overlapping junctions 15 and 16, by including donor impurities in the electrode in the manner known to workers in the art, the connection to P-type zones 12 and 14 may be made a high resistance connection whereby effectively electrode 18 makes a low resistance connection only to N-type zone 13.

The input circuit connected between emitter electrode 17 and base electrode 18 includes a signal source 20 and a steady voltage source 21 poled as shown to bias the emitting junction in reverse to a value beyond the point of avalanche breakdown whereby both the resistance and capacitance of the junction are small. As is well known by appropriate design of the junction with particular regard to the gradient of impurity concentrations in silicon, breakdown may be made to occur at voltages as low as several volts and as high as many hundreds of volts. Under these conditions, the signal provided by source 20 readily modulates the number of electrons produced at the region of the emitting junction which flow into the N-type base layer.

For useful operation, it is necessary that such electrons escape from the base and cross NP collecting junction 16. In particular, it is important that the base 13 be sufficiently thin that electrons produced at the region of the emitting junction with velocities characteristic of breakdown will penetrate such layer. To this end, the base 13 advantageously has a thickness no greater than several hundred angstroms and preferably less than 100 angstroms.

For power gain, it is also important that the collecting junction 16 exhibit a high impedance. However, for efficient collection of the electrons by the collecting junction, it is advantageous that such junction be biased in the forward direction, i.e., that the collector electrode 19 be biased positively with respect to the base electrode 18 for the collection of the negatively charged electrons. Such forward bias is in contradistinction to the negative bias characteristically maintained on the collecting junction of a conventional junction transistor, such difference arising because in this instance majority, rather than minority, carriers are being collected from the base.

A forward-biased junction does exhibit a high impedance so long as the applied voltage is sufficiently low, typically so long as the applied voltage is not significantly more than corresponds to the width of the gap between the conduction and valence band of the semiconductor employed. In silicon this width corresponds to about 1.1 volts. It is higher and lower in other semiconductors.

To this end, the output circuit connected between electrodes 18 and 19 includes the load shown as the resistor 22 and a voltage source 23 of appropriate magnitude and which is poled as shown to maintain a positive bias on the collecting junction 16.

In the amplifier 30 shown in FIG. 2 the semiconductive device 31 comprises a semiconductive wafer, typically monocrystalline silicon, which includes a relatively large P-type emitter zone 32 and a thin N-type base zone 33 defining typically no more than 100 angstroms thick therebetween an emitting PN junction 34. Emitter and base electrodes 35 and 36 make low resistance ohmic connections to zones 32 and 33, respectively. Additionally, a thin insulating film advantageously of silicon dioxide formed in situ and no more than 100 angstroms thick, forms a closely adherent layer 37 over the major portion of zone 33 which is removed from electrode 36, and a collector electrode 38 extends over most of such layer 37.

The input circuit which is connected between electrodes 35 and 36 comprises a signal source 39 and a steady voltage source 40 poled as shown to bias the emitting PN junction 34 in reverse past breakdown.

The output circuit which is connected between electrodes 36 and 38 comprises a load shown as the resistor 41 and a steady voltage source 42 poled as shown to bias electrode 38 positively with respect to electrode 36. In this embodiment, since a high impedance is assured by the presence of insulating layer 37 the bias need not advantageously be less than the voltage corresponding to the gap width of the semiconductor.

The operation of this amplifier 30 resembles that of the amplifier 10 shown in FIG. 1. Input signals are used to modulate the breakdown current of emitting junction 34 and accordingly the number of electrons which are generated in zone 33 for penetration therethrough and through the insulating layer 37 for collection by collector electrode 38.

It is to be understood that the specific embodiments described are merely illustrative of the general principles of the invention. The semiconductive device may comprise wafers of various other semiconductive materials, such as germanium, germanium-silicon alloys, and group III—group V semiconductive compounds.

Additionally, the amplifiers described have been designed for class A operation. By suitable adjustment of the biasing voltage provided by the input circuit, other modes of operation are feasible. In particular, by elimination of the steady voltage source in the input circuit, an amplifier which amplifies only pulses of amplitude sufficient to drive the emitting junction into breakdown becomes available.

It will also be obvious that by providing adequate feedback between the input and output circuits, an oscillator can be realized.

What is claimed is:

1. In combination, a semiconductive device including three layers of which the first two at least are semiconducting and of opposite conductivity type for defining a rectifying junction therebetween and a separate electrode associated with each layer, an input circuit connected between the two electrodes associated with the first two layers including means for applying across the rectifying junction a reverse voltage in excess of its characteristic breakdown voltage and for varying the applied voltage in accordance with signal information, and an output circuit connected between the electrodes associated with the second and third layers and including a load and means for biasing the electrode associated with the third layer forward with respect to the electrode associated with the second layer.

2. In combination, a semiconductive device including emitter, base and collector zones defining emitting and collecting junctions, and emitter, base and collector electrodes, an input circuit connected between the emitter and base electrodes including means for establishing across said emitting junction a reverse voltage in excess of its characteristic breakdown voltage and for varying the voltage applied thereacross in accordance with signal information, and an output circuit connected between the base and collector electrodes including a load and means for establishing across the collecting junction a forward voltage of a value for making such junction a high impedance to the carriers collected thereby.

3. In combination, a semiconductive device including emitter and base zones defining an emitting junction and emitter, base and collector electrodes, the collector electrode being separated from the base zone by a dielectric film, an input circuit connected between the emitter and base electrodes including means for establishing across the emitting junction a reverse voltage in excess of its characteristic breakdown voltage and for varying the voltage applied thereacross in accordance with signal information, and an output circuit connected between the base and collector electrodes including a load and means for biasing the collector electrode forward with respect to the base electrode.

4. In combination, a semiconductive device comprising a semiconductive wafer including therein three zones, contiguous zones being of the opposite conductivity type for defining an emitting junction and a collecting junction, and a separate electrode making a low resistance connection to each of the three electrodes, and circuit means connected between the three electrodes including means for applying a reverse voltage on the emitting junction in excess of the reverse breakdown voltage and for varying such reverse voltage in accordance with signal information for varying the number of majority carriers introduced into the intermediate zone, means for applying across the collecting junction a forward voltage less than the forward breakdown voltage, and a load in series with the collecting junction.

References Cited in the file of this patent

UNITED STATES PATENTS

| | | |
|---|---|---|
| 2,524,033 | Bardeen | Oct. 3, 1950 |
| 2,778,956 | Dacey et al. | Jan. 22, 1957 |
| 2,791,759 | Brown | May 7, 1957 |
| 2,904,704 | Marinace | Sept. 15, 1959 |

OTHER REFERENCES

Voltage Punch Through and Avalanche Breakdown and Their Effect on Maximum Operating Voltages for Junction Transistor by Schenkel and Statz, published in Proceeding of National Electronics Conference, vol. 10, 1954, pp. 614–625.